(12) United States Patent
DeCesare et al.

(10) Patent No.: US 6,950,311 B1
(45) Date of Patent: Sep. 27, 2005

(54) TELECOMMUNICATIONS SWITCH/SERVER

(75) Inventors: John R. DeCesare, Sandwich, MA (US); James F. Allen, Sandwich, MA (US); Kathleen M. Lacey, Centerville, MA (US); Jesse A. Faunce, Raynham, MA (US); Peter Hynes Corsini, East Sandwich, MA (US)

(73) Assignee: Excel Switching Corporation, Hyannis, MA (US)

( * ) Notice: Subject to any disclaimer, the term of this patent is extended or adjusted under 35 U.S.C. 154(b) by 0 days.

(21) Appl. No.: 10/783,961

(22) Filed: Feb. 20, 2004

(51) Int. Cl.[7] ............................. H05K 7/16; H05K 7/00; H01R 12/16
(52) U.S. Cl. ..................... 361/727; 361/728; 361/752; 361/785; 439/761
(58) Field of Search ................................ 361/683–686, 361/724–736, 740–744, 747–748, 752, 801–803, 361/792, 796, 785; 312/223.2; 439/65, 76.1

(56) References Cited

U.S. PATENT DOCUMENTS

| | | | | |
|---|---|---|---|---|
| 3,794,954 | A * | 2/1974 | Reimer | 439/62 |
| 4,084,250 | A * | 4/1978 | Albertine et al. | 361/687 |
| 4,840,568 | A * | 6/1989 | Burroughs et al. | 439/49 |
| 5,031,074 | A * | 7/1991 | Ravid | 361/683 |
| 5,457,601 | A * | 10/1995 | Georgopulos et al. | 361/686 |
| 5,801,922 | A * | 9/1998 | Shen et al. | 361/686 |
| 6,035,356 | A * | 3/2000 | Khan et al. | 710/301 |
| 6,411,506 | B1 * | 6/2002 | Hipp et al. | 361/686 |
| 6,490,156 | B2 * | 12/2002 | Chen | 361/686 |
| 6,724,636 | B2 * | 4/2004 | Yamamoto et al. | 361/747 |
| 6,789,148 | B1 * | 9/2004 | Hinds | 710/300 |
| 6,822,874 | B1 * | 11/2004 | Marler | 361/752 |

* cited by examiner

Primary Examiner—Phuong T. Vu
(74) Attorney, Agent, or Firm—Cesari and McKenna, LLP; John F. McKenna

(57) ABSTRACT

The switch has a passive section and an active section or tray that may be docked to the passive section. The passive section contains only the physical interfaces to the switch's external data and telephony networks and power input. It is not intended to be a field replaceable unit and is therefore intended to be mounted in a rack system with all of the power and communications cables attached thereto. The telephony and data ports are routed from the passive section to the active section via connectors on the two sections as well as to a redundancy connector on the passive section that may be physically connected by a cable to a slave unit in a redundant application. The active section or tray contains all of the active components of the switch and is inserted via guides into the passive section. The tray is considered a field replaceable unit and can be inserted into and extracted from the passive section while the system is powered up and operational. As a result of its unique two-section design, the present switch has several advantages. For example upon failure, all active components of the system may be replaced without removing the mounting hardware from the rack in which the switch is mounted and without removing any cables connected to the switch. Also when the switch is part of a redundant system, when the switch fails, all of the active components of the switch may be replaced without interrupting system operations.

8 Claims, 3 Drawing Sheets

TELECOMMUNICATIONS SWITCH/SERVER

This invention relates to telephony and data communication apparatus. It relates especially to an improved telecommunications switch/server.

BACKGROUND OF THE INVENTION

A telecommunications switch/server is used to route message traffic over a network. Conventionally, it comprises a chassis or housing containing a single printed circuit motherboard or back plane which supports and interconnects a multiplicity of electrical components that enable the switch to perform its functions, e.g. processors, memories, line interface units, etc. The chassis usually also includes a front panel to which is mounted various switches, indicators and displays that enable one to control and monitor the operation of the switch/server. Electrical connections to and from the switch are made by way of a multiplicity of data and telephony ports mounted in a rear wall of the chassis. Cables plugged into ports at the rear of the chassis connect the switch to outside lines and to other units comprising the overall telecommunications system. Indeed, a typical switch may have forty or more cables plugged into the rear of the chassis.

A typical switch/server of the type of which we are concerned here is normally mounted in a cabinet or rack along with similar switches and other equipment making up the telecommunications system. After positioning each switch in the cabinet or rack, the switch chassis is fastened in place and the many cables are plugged into the ports at the rear of the switch.

The prior switches of this type are disadvantaged in that if the switch fails for one reason or another, the entire switch chassis has to be unfastened and removed from its cabinet or rack so that the switch can be inspected and repaired or replaced. In order to do this, however, all of the many cables at the end of rear of the switch must be disconnected from the switch. Since the rear of the cabinet or rack containing the switch is often in a difficult-to-access location, this can be a tedious and time-consuming task. This is particularly so if the defective switch is being replaced in the field by a new switch to which the cables must be connected in the proper configuration. In other words, unless special care is taken during such replacement, there is a likelihood that one or more cables will be plugged into the wrong port at the rear of the new switch, all of which increases the down time of the system operations that rely on the switch.

SUMMARY OF THE INVENTION

Accordingly, it is an object of the present invention to provide an improved telecommunications switch/server.

Another object of the invention is to provide a switch of this type all of whose active components can be replaced without removing any hardware securing the switch to its cabinet or rack.

Still another object of the invention is to provide such a switch which does not require the removal of any cabling in the event of a switch failure.

Yet another object of the invention is to provide a telecommunications switch/server all of whose active components can easily be replaced in the field without disconnecting any cables at the rear of the switch.

A further object of the invention is to provide a switch of this type which includes a special redundancy connector enabling the switch to be connected to a companion or standby switch in a redundant system so that upon failure detection in the primary unit, all telephone and data traffic is automatically switched to the standby unit without any user intervention or re-cabling so that there is no interruption of system operations.

Other objects will, in part, be obvious and will, in part, appear hereinafter.

The invention accordingly comprises the features of construction, combination of elements and arrangement of parts which will be exemplified in the following detailed description, and the scope of the invention will be indicated in the claims.

Briefly, our switch comprises a passive section and an active section or tray that may be docked to the passive section. The passive section contains only the physical interfaces to the switch's external data and telephony networks and power input. The passive section is not intended to be a field replaceable unit and is, therefore, intended to be mounted in a rack system with all of the power and communications cables attached thereto.

The telephony and data ports are routed from the passive section to the active section or tray via connectors on the two sections as well as to a redundancy connector on the passive section that may be physically connected by a cable to a similar standby or slave switch in a redundant or fail-safe application.

The active section or tray contains all of the active components of the switch and is inserted via guides into the passive section. The tray is considered a field replaceable unit and can be inserted and extracted from the passive section while the system is powered up and operational.

As a result of its unique two-section design, the present switch has many advantages. For example upon failure, all active components of the switch may be replaced without removing the mounting hardware from the cabinet or rack in which the switch is mounted and without removing any cables connected to the switch. Also when the switch is part of a redundant system, when the switch fails, all of the active components of the switch may be replaced without interrupting any active service or system operations. That is, in such a redundant system, upon failure detection, all telephony and data traffic are automatically switched to the redundant or standby unit without any user intervention or recabling.

As will be described in more detail later, the switch comprises a passive section which includes a housing having a bottom wall, a pair of upstanding side walls, an upstanding rear wall and an open front. A multiplicity of signal ports are mounted to the rear wall and an I/O circuit board is supported on the bottom wall. A first electrical connector is mounted to the I/O board adjacent to the front edge thereof, that connector having a multiplicity of pins or contacts. Also, the I/O board carries only non-active components of the switch and defines a multiplicity of passive signal spans between those ports and the contacts of the first connector.

The switch also includes a tray which is slidable into the housing through the open front thereof. That tray includes a pan having a bottom wall, a pair of upstanding side walls and an upstanding front wall. A printed circuit motherboard is supported on the bottom wall of the pan and carries all of the active components of the switch. A second connector is mounted to that motherboard adjacent to a rear edge thereof. The motherboard defines all of the signal paths between the active components thereon and the contacts of a second connector mounted on the motherboard at the rear edge thereof. The first and second connectors are arranged and adapted so that when the active section or tray is slid into the housing to a home position, the contacts of the first and second connectors establish all of the electrical connections between the ports at the rear of the passive section and the active components of the tray that are necessary for normal operation of the switch. Thus when there is a switch malfunction, that may be taken care of without demounting the switch or removing any cable connections thereto simply by removing and replacing the switch's active section or tray.

BRIEF DESCRIPTION OF THE DRAWINGS

For a fuller understanding of the nature and objects of the invention, reference should be made to the following detailed description taken in connection with the accompanying drawings, in which.

DESCRIPTION OF THE PREFERRED EMBODIMENT

Figure 1:
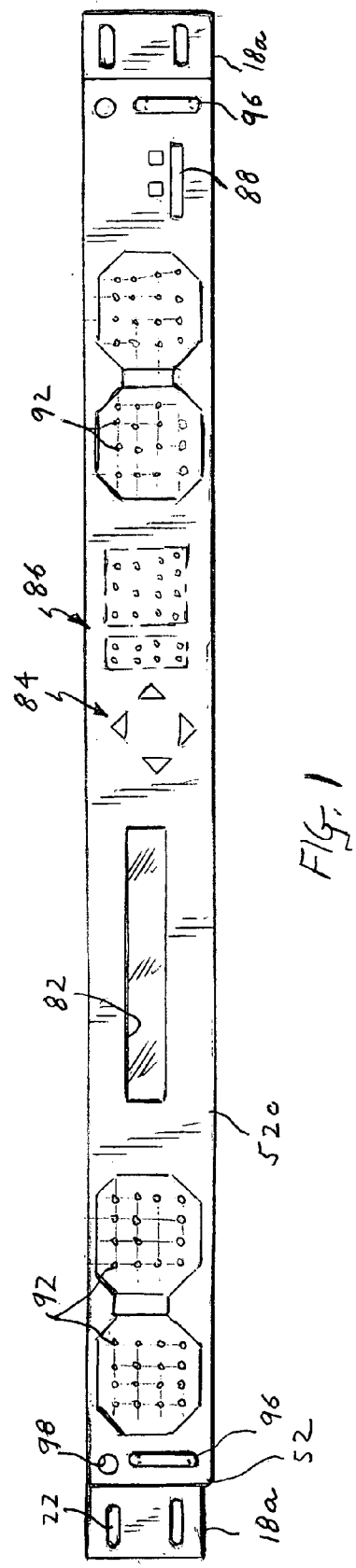
FIG. 1 is a front elevational view of a telecommunications switch/server incorporating the invention.
Figure 2:
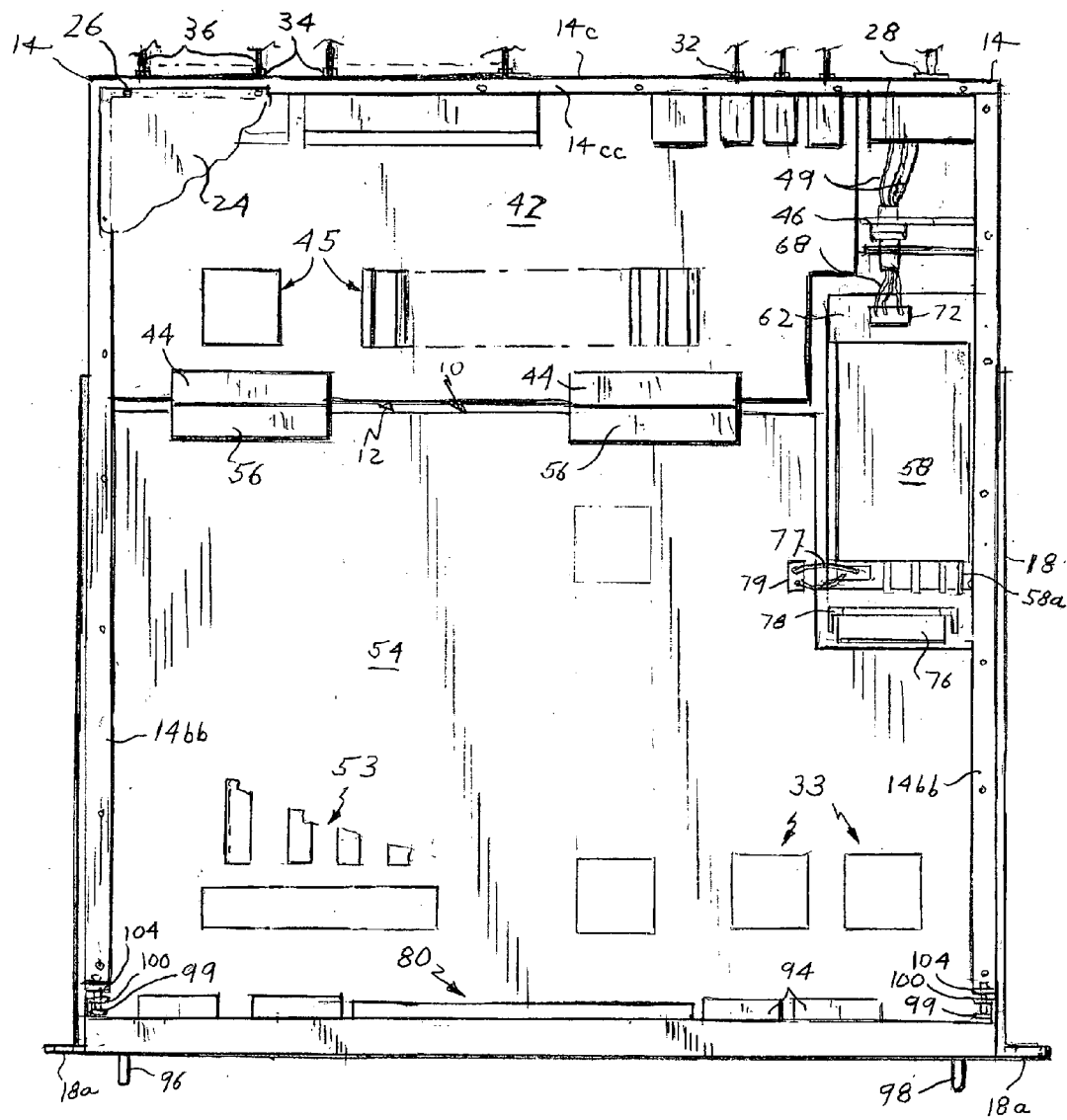
FIG. 2 is a top plan view with parts broken away of the FIG. 1 switch/server showing the unit's active section or tray in its closed or docked position.
Figure 3:
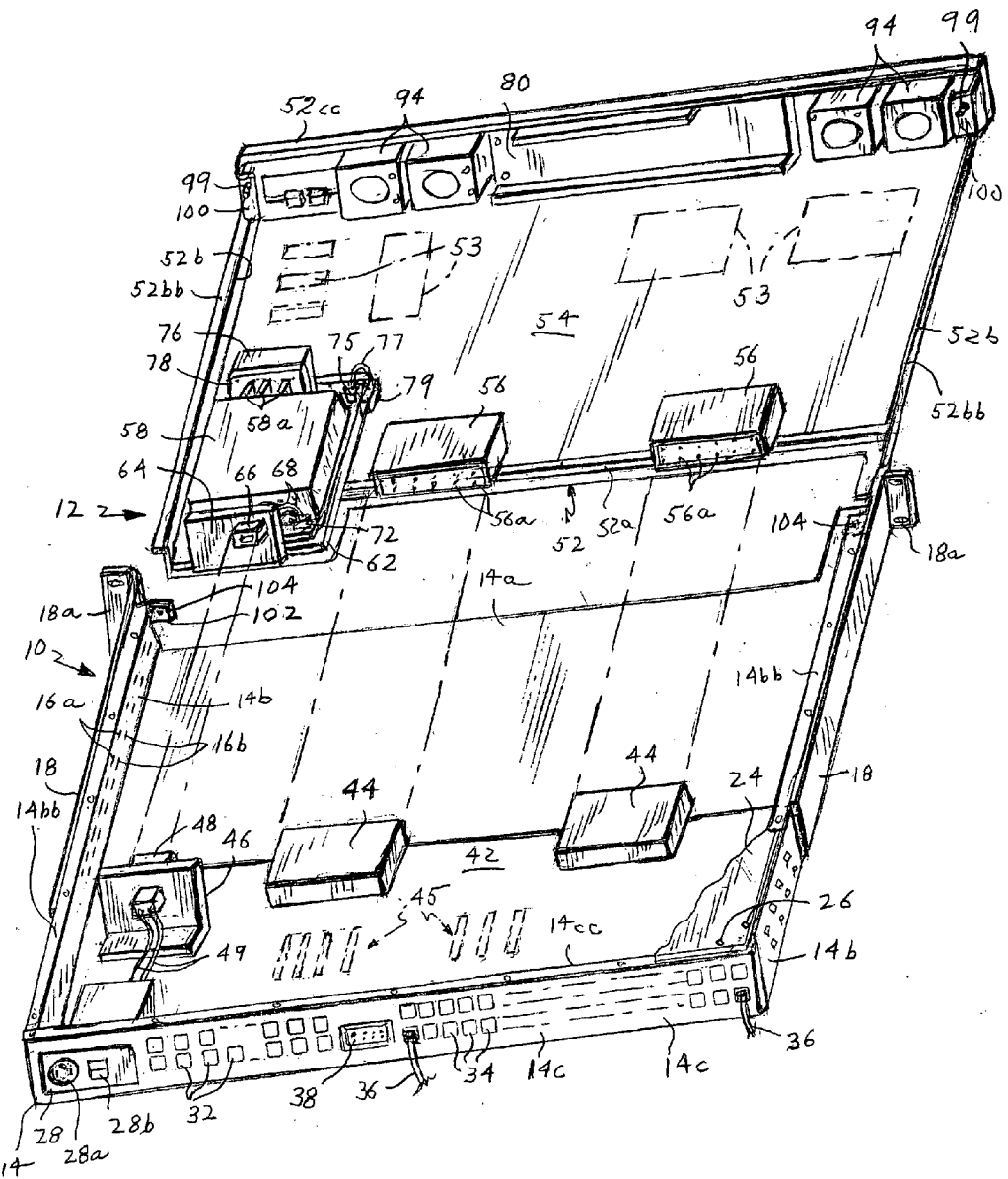
FIG. 3 is a right rear perspective view from above showing the FIG. 1 switch/server with its active unit or tray in its open or un-docked position.

Referring to FIGS. 1 to 3 of the drawings, the present switch/server comprises a passive section shown generally at 10 and an active section or tray 12 adapted to dock to section 10. As we shall see, section 10 contains only the physical interfaces to the data and telephony networks and power input to the switch, while tray 12 carries all of the active components of the switch such as processors, memories, line interface units, power supply, etc. When section 12 is docked to section 10, all of the necessary connections are made between the two sections to enable the switch to perform all of its functions.

The connections to the switch are all made at ports at the rear of the passive section 10. Therefore, that section may be permanently mounted in a rack or cabinet. In other words, it is not intended to be a field replaceable unit. The active section or tray 12, on the other hand, is designed to slide into and dock to section 10. Therefore, if a switch malfunction should occur, that may be taken care of in the field simply by undocking and replacing section 12 with a new tray. Unlike the case with conventional switch/servers of this general type, no mounting hardware has to be removed and no cables have to be disconnected in order to restore the switch operations. Therefore, repairs may be made expeditiously in the field so that the switch operations suffer minimum down time.

As best seen in FIG. 3, passive section 10 comprises a housing 14 having a bottom wall 14a, a pair of upstanding side walls 14b and a rear wall 14c. The upper edge margins of side walls 14b are bent to form in-turned flanges 14bb.

Also, both side walls 14b are struck to form upper and lower rows of guides 16a and 16b which project inward to define between them horizontal slides 17 to facilitate docking tray 12 in section 10 as will be described later.

The illustrated section 10 also has straps 18 fastened to the outsides of side walls 14b to facilitate mounting section 10 in a cabinet or rack. Out-turned flanges 18a at the fronts of the straps have holes 22 for receiving fasteners that anchor the straps to the cabinet or rack. Of course, if the switch is simply resting on a table or other surface, the straps 18 may be omitted.

Still referring to FIG. 3, the rear wall 14c of housing 14 has an in-turned flange, 14cc. The flanges 14bb and 14cc constitute support surfaces for a cover 24 removably secured to those flanges by suitable fasteners 26.

The rear wall 14c is provided with cut outs enabling that wall to support various electrical components that enable the switch to perform its function. These components may include a power input 28 having a connector 28a that may be connected to a power cable and an ON/OFF switch 28b. Rear wall 14c also carries a multiplicity of ports or receptacles including data ports 32 and telephony ports 34. A typical switch may have forty or more of such connectors for coupling signals to and from the switch via cables 36 plugged into those ports.

The illustrated passive section 10 also includes a special redundancy connector 38 for coupling the switch to a similar standby or slave switch in a redundant system so that upon failure detection in the illustrated switch, all telephone and data traffic is automatically switched to the standby unit so that there is no interruption in system service. While the standby or slave unit is performing system operations, the tray 12 may be removed and replaced with a new tray at which point the illustrated switch will take over from the standby unit and resume normal operation. This redundancy feature is described in detail in application Ser. No. 10/783, 984, entitled REDUNDANCY ARRANGEMENT FOR TELECOMMUNICATIONS SWITCH, the contents of which are incorporated herein by reference.

Still referring to FIG. 3, a printed circuit I/O board 42 is mounted via standoffs (not shown) to housing bottom wall 14a. I/O board 42 extends from rear wall 14c about a third of the way toward the front of housing 14 and supports at its leading or forward edge one or more connectors 44. As will be described, each connector 44 is adapted to mate to a corresponding connector on tray 12 when the tray is docked to section 10. Preferably, the pins or contacts of each connector are staggered to allow hot insertion and extraction of the contacts with those of corresponding connectors on tray 12 with proper electrical grounding.

In accordance with the invention, I/O board 42 also carries various passive electrical components and signal spans indicated at 45 required to interface with ports 32, 34 and 38 all the signals delivered to and from the active components of the switch on tray 12, which signals are present at connector(s) 44.

As shown in FIG. 3 the housing bottom wall 14a also supports an upstanding bracket 46 to which is mounted one or more power connectors 48 for coupling power from the power unit 28 at the rear of housing 14 via wires 49 to connector(s) 48 and then to tray 12 when tray 12 is docked to section 10 as will be described.

Refer now to FIGS. 1 and 3 which show the active section or tray 12 in detail. Tray 12 includes a metal pan or a base 52 having a bottom wall 52a, a pair of opposite side walls 52b and a front wall 52c which extends above side walls 52b to the height of the housing side walls 14b.

As shown in FIG. 3, the upper edge margin of side walls 52b are bent outward to form lips 52bb. These lips constitute sliders adapted to slide along the slides 17 defined by the upper and lower rows of guides 16a and 16b on housing side walls 14b to facilitate docking tray 12 to passive section 10.

Mounted to the tray bottom wall 52a via stand-offs (not shown) is a printed circuit board (PCB) 54 which constitutes a motherboard that supports and interconnects all of the various active components of the switch. These components are indicated at 53 and may include memories, processors, line interface units, etc. Also mounted to the rear edge of PCB 54 is one or more connectors 56 each of which is adapted to mate with a corresponding connector 44 on passive section 10 when tray 12 is docked to section 10. As noted above, the pins or contacts 56*a* of the connectors are staggered to allow the connector(s) 56 to be inserted into and extracted from connectors 44 while the switch is powered up.

Tray 12 also carries a power supply 58. The supply is mounted to a printed circuit board PCB 62 spaced from the tray bottom wall 52*a*. A bracket 64 extending up from bottom wall 52*a* supports a connector 66 which is adapted to plug into connector 48 on section 10 when tray 12 is docked to section 10. Connector 66 is connected by wires 68 to a connector 72 on circuit board 62 which delivers power to power supply 58. The output of the power supply is delivered to a connector 75 on PCB 62, that connector, in turn, being connected by wires 77 to a connector 79 on PCB 54.

Preferably, the power supply 58 includes a heat sink 58*a* which may be cooled by a dedicated fan 76 mounted to a bracket 78 extending up from pan bottom wall 52*a* in front of the heat sink. Also in some applications, tray 12 may have redundant power supplies in which case the switch may include two connector pairs 48,66 to serve the two power supplies.

As shown in FIGS. 1 and 3, the front wall 52*c* of pan 52 supports a printed circuit board 80 that carries various components for controlling and monitoring the switch, which components are accessible through openings in that wall. In the illustrated unit, there is an LCD display 82, a select switch shown generally at 84, LED displays 86 and a slot 88 for a flash memory card. The front wall 52*c* may also be provided with a multiplicity of appropriately placed vent openings 92 through which air can circulate to fan units 94 mounted to the rear of front wall 52*c*. These fans are arranged to direct air across the electrical components mounted to PCB 54 of tray 12.

Mounted to the front of the pan front wall 52*c* adjacent to the opposite ends thereof is a pair of handles 96 to facilitate sliding tray 12 relative to passive section 10 between its open or undocked position illustrated in FIG. 3 and its docked position shown in FIG. 2. Preferably, access holes 98 are provided adjacent the opposite ends of the front wall 52*c* to give tooled access to fasteners 99 captured in brackets 100 spaced behind front wall 52*c*. When tray 12 is in its docked position shown in FIG. 2, fasteners 99 may be turned down into threaded holes 102 formed in in-turned tabs 104 at the front or leading ends of housing side walls 14*b* as seen in FIGS. 2 and 3.

As tray 12 is being docked to passive section 10, the sliding engagements of the tray lips 52*b* and guides 16*a* and 16*b* help to align the tray with section 10 so that the connectors 56 and 66 on the tray line up with the corresponding connectors 44 and 48, respectively, on section 10. When the tray is pushed to its fully closed or home position shown in FIG. 3, the connectors on the tray will plug into the corresponding connectors on section 10.

As noted at the outset, the passive section 10 of the subject switch may be mounted in a cabinet or rack and all of the necessary cables may be plugged into the connector 28*a* and ports 32, 34 and 38 at the back of section 10. If the switch should malfunction, it is not necessary to remove section 10 from the cabinet or rack or to disconnect any of the cables plugged into the rear of that section. Rather, all that is required is that the fasteners 99 be loosened and tray 12 be withdrawn from section 10 at the front of the cabinet or rack and that tray replaced by a new tray slid into section 10. As noted above, if the illustrated switch is part of a redundant system that is connected via the redundancy connector 38 to a standby unit, a malfunction in the illustrated switch automatically switches service to the standby unit so that there is no interruption in service.

It will thus be seen that the objects set forth above among those made apparent from the preceding description are efficiently attained. Also, since certain changes may be made in the above construction without departing from the scope of the invention, it is intended that all of the matter contained in the above description or shown in the accompanying drawings be interpreted as illustrative and not in a limiting sense.

It is also to be understood that the following claims are intended to cover all of the generic and specific features of the invention described herein.

What is claimed is:

1. A telecommunication switch comprising
a passive section including
  a housing having a bottom wall, a pair of upstanding side walls, an up-standing rear wall and an open front,
  a multiplicity of signal ports mounted in said rear wall,
  an I/O circuit board supported on the bottom wall, said I/O board having a front edge,
  a first electrical connector mounted to said I/O board adjacent to the front edge thereof, said first connector having a multiplicity of contacts, said I/O board carrying only non-active components of the switch and defining a multiplicity of signal spans between said ports and the contacts of said first connector, and
a tray slidably received in said housing through the open front thereof, said tray including
  a pan having a bottom wall, a pair of upstanding side walls and an up-standing front wall,
  a printed circuit motherboard supported on the bottom wall of the pan, said motherboard having a rear edge and carrying all of the active components of the switch, and
  a second connector mounted to the motherboard adjacent to the rear edge thereof, said second connector having a multiplicity of contacts that are mateable with the contacts of the first connector, said motherboard defining signal paths between the active components thereon and the contacts of the second connector,
  said first and second connectors being arranged and adapted so that when said tray is slid into said housing to a home position, the corresponding contacts of the first and second connectors are coupled together so as to establish all of the electrical connections between said ports and said active components that are needed for normal operation of the switch.

2. The switch defined in claim 1 wherein
the passive section also includes a power port mounted in the rear wall of said housing and a first power connector supported by the housing and connected electrically to the power port, and
the tray also includes a power supply supported by the pan, said power supply having an output connected electrically to the motherboard and an input, and a second power connector supported by the pan and connected electrically to the power supply input, said first and second power connectors being arranged and adapted so that when the tray is slid into the housing to said home position, said first and second power connectors connect the power port to the power supply.

3. The switch defined in claim 1 wherein the front wall of the tray is dimensioned so that when the tray is in said home position, said front wall closes the front opening into said housing.

4. The switch defined in claim 1 wherein the tray also includes a PC board carrying control components accessible through openings in the front wall of said pan.

5. The switch defined in claim 1 and further including interfitting portions on the side walls of said housing and said tray for guiding the tray to and from said home position.

6. The switch defined in claim 4 and further including means for releasably fastening the tray in said home positioning in the housing.

7. The switch defined in claim 1 wherein the passive section also includes a redundancy connector mounted in the rear wall of the housing for connecting the switch via a cable to a similar standby switch.

8. The switch defined in claim 1 and further including a cover releasably secured to the side and rear walls of the housing thereby closing the top of the housing.

* * * * *